United States Patent
Benton

(10) Patent No.: US 9,417,291 B2
(45) Date of Patent: Aug. 16, 2016

(54) LIGHTING MAINTENANCE, TESTING AND REPAIR KIT AND METHOD OF USE THEREOF

(71) Applicant: Virgil Benton, Rancho Santa Fe, CA (US)

(72) Inventor: Virgil Benton, Rancho Santa Fe, CA (US)

( * ) Notice: Subject to any disclaimer, the term of this patent is extended or adjusted under 35 U.S.C. 154(b) by 179 days.

(21) Appl. No.: 14/055,274

(22) Filed: Oct. 16, 2013

(65) Prior Publication Data

US 2015/0102814 A1    Apr. 16, 2015

(51) Int. Cl.
*G01R 31/00* (2006.01)
*H01H 31/02* (2006.01)
*G01R 31/44* (2006.01)
*H05B 37/03* (2006.01)

(52) U.S. Cl.
CPC ............... *G01R 31/44* (2013.01); *H05B 37/03* (2013.01)

(58) Field of Classification Search
CPC .................................. G01R 31/44; H05B 37/03
USPC ............................ 324/414, 402.09, 403, 556
See application file for complete search history.

(56) References Cited

U.S. PATENT DOCUMENTS

| | | | |
|---|---|---|---|
| 5,179,339 A * | 1/1993 | Volk, Jr. ................. | H01K 3/305 324/403 |
| 5,319,312 A * | 6/1994 | Segilia .......................... | 324/556 |
| 6,556,018 B2 * | 4/2003 | Benton .......................... | 324/414 |
| 8,672,510 B1 | 3/2014 | Budelman | |
| 2007/0013772 A1 * | 1/2007 | Tham ............... | G01N 21/95607 348/87 |
| 2008/0224708 A1 * | 9/2008 | Mannerfelt .................... | 324/414 |
| 2012/0007602 A1 * | 1/2012 | Morrow et al. ................ | 324/414 |

* cited by examiner

*Primary Examiner* — Farhana Hoque
(74) *Attorney, Agent, or Firm* — Gordon Rees Scully Mansukhani LLP

(57) ABSTRACT

The present invention is directed, in part, to an apparatus and methods thereof that effectively allow the testing, detection and identification of non-functioning light bulbs used in typical string lighting assemblies set up in series. The invention creates a circuit that determines whether there is a damaged bulb in holiday or occasion lighting assemblies by employing use of a power source, such as for example, a 9-volt battery, two wire leads and two terminals that create an electrical circuit when the terminals are attached to the lighting assembly wiring by means of the terminals. When the test kit is attached and the bulbs fail to illuminate, a user is thereby informed that a bulb within that series is damaged or otherwise non-functional. By further narrowing the number of bulbs tested, the kit allows the user to identify the damaged bulb and replace the bulb quickly and easily.

16 Claims, 7 Drawing Sheets

LIGHTING MAINTENANCE, TESTING AND REPAIR KIT AND METHOD OF USE THEREOF

FIELD OF THE INVENTION

The present invention relates generally to an improved method and apparatus for diagnosing and making repairs to individual light bulbs in lighting assemblies. Specifically, the invention relates to a device kit that diagnoses and precisely identifies non-functioning light bulbs in lighting assemblies such as for example, holiday string lighting, and allows a user to determine the non-functioning bulb, thus allowing the user to replace the non-functioning bulb with a functioning bulb.

BACKGROUND OF THE INVENTION

Since the advent and use of electrical lighting, modern society has sought to illuminate homes and communities in a wide variety of ways. Notably, the use of electrical string lighting during the holidays or during special occasions has created a multi-billion dollar market in the sale of string lighting, holiday lighting and occasion lighting assemblies. Most mini light sets and holiday lighting assemblies are electrically connected in series, therefore when just one single bulb in a light string assembly breaks, fails or blows out, it causes the whole section of lights on the same circuit to go out. Some light string assemblies have only one circuit of lights, consequently when one bulb blows out the entire lighting string goes out and fails to illuminate despite the fact that it's just one bulb that is defective.

Typically, holiday string lighting consists of 50—2.4 volt lights (2.4×50=120 volts) in each circuit series of power driven bulbs, which are connected in series to one another by means of an electrically conductive wiring scheme. In turn, an electrical voltage via AC power outlet or battery, powers the series circuit lighting. As is well known in the art, in the event one bulb in such a series circuit fails or is damaged, a complete shutdown of the series circuit results.

As a result, due to the relatively low cost of such string lighting, damaged or non-functioning string lighting is simply thrown out since the time and effort required by a user to examine and diagnose each bulb far outweighs the cost of simply purchasing new holiday or occasion string lighting.

It is also notable that the prior art has offered no practical solution which allows a user the ability to diagnosis a specific point at which a series circuit is broken thus, allowing the user to simply replace the broken bulb as opposed to throwing out the entire string lighting assembly.

For example, U.S. Pat. No. 4,772,806 to Lean et. al, describes a switching device for uncoupling defective circuit components from a series loop circuit so as to allow the continued operation of the remaining components of the circuit loop. The document further describes a method of installing and using a switching device in a series loop circuit to simplify the maintenance of such a loop circuit. The patent further describes a means for accessing the primary circuits of an assemblage of series-connected power driven components without having to open or remove the components.

The device described therein however, is employed in an industrial type setting such as occurs in, for example, short section of a series circuit of a power line installed underground. Such industrial applications do not assist in diagnosing and identification of a defective, non-functioning light bulb on a series circuit holiday or occasion string lighting assembly. Moreover, the cost of such a device precludes its applicability to a smaller scale device such as would be required for holiday/occasion string lighting.

It is not uncommon that at least one strand of decorative lights such as those used during the holidays to decorate homes, trees and the like suffers from a defective bulb or bulb socket that causes the outage of the other bulbs where all of the bulbs are wired in series in strand sets possessing a plurality of light bulbs. In such cases, if one bulb is missing, broken or otherwise non-functional, then the remaining functioning light bulbs on the circuit will also fail to illuminate as a result of the defective bulb or bulb socket.

This is especially true where an affected strand is one of many used to produce specialty-type lighting collections such as the popular icicle-type lighting used for roofing decoration to simulate icicles hanging from the roof. Likewise, "net" type lighting is used for decorating shrubbery and small trees. In the event a single bulb or bulb socket becomes inoperable, then the entire strand then fails to illuminate and the most natural inclination by a user is to simply discard the strand and to purchase new lighting.

Another holiday light style are so-called "candy cane" lights. These lights are fitted most often with ground stakes that placed in the ground to decorate pathways, walkways, planters and other areas as well. The lights are typically sold with a housing in the shape and color of a candy cane, with the series circuit lights inside the housing. Usually sold with 6 to 8 candy canes per light string and 5-6 lights in each cane. Therefore these lights have only one series circuit and when one lights blows out the entire string of candy cane lights go out.

The present invention allows a user the following advantages with regarding to this lighting scheme: (1) how to identify the candy cane light(s) with the defective bulb, (2) how to remove the lights from the housing using tools provided in the repair kit (3) how to locate the defective bulb and replace it using replacement bulbs (4) Reinstalling the light string in the candy cane with the tools provided in the test kit. Moreover, candy cane lights are much more expensive than the other common light styles. It is therefore a purpose of the present invention to address these shortcomings.

Specifically, the invention described herein provides a novel device and methods that allow for the diagnosis and identification of broken bulbs in a holiday or occasion lighting assembly. It is further an object of the invention that once identified, the non-functioning bulb can be replaced with a functional bulb thus, negating the general practice of simply throwing out a holiday string lighting assembly when one of the bulbs in the assembly is blown. It should be understood that the detailed description while indicating preferred embodiments of the invention, are given by way of illustration only since various changes and modifications within the spirit and scope of the invention would be apparent to those skilled in the art from the following detailed description.

It is therefore a purpose of the present invention to address these shortcomings. Specifically, the invention described herein provides a novel device and methods that allow for the precise identification of broken bulbs in a holiday or occasion lighting assembly set up in series with a plurality of other light bulbs. It is further an object of the invention that once identified, the non functioning bulb can be replaced with a functional bulb and thus, negating the general practice of simply throwing out a holiday string lighting assembly when one of the bulbs in the assembly is blown.

It should be understood that the detailed description while indicating preferred embodiments of the invention, are given by way of illustration only since various changes and modifications within the spirit and scope of the invention would be apparent to those skilled in the art from the following detailed description.

SUMMARY OF THE INVENTION

The present invention is directed to methods and an improved device for testing, detection and easy repair of a non-functional string lighting assembly that is non-functional due to a damaged bulb that is situated electrically in series with the remainder of bulbs that are functional. The invention provides an economical test kit and a method that allows a user to quickly and precisely identify a damaged, non-functional bulb or bulb socket and thereafter, replace that bulb with a functioning bulb allowing the user to continue use of the string lighting assembly and to forego the necessity of taking a significant amount of time to test each bulb until the defective bulb is identified or to purchase a new lighting string assembly.

The invention further includes a method of locating a defective bulb or bulb socket in a strand of electrically powered lights all connected in series and typically in circuit sets possessing a plurality of bulbs on one circuit wherein a user can quickly and precisely determine the bulb or bulb socket that is damaged or otherwise non-functional in order to replace the bulb(s).

As described, the present invention relates to a device and methods for locating a defective bulb or bulb socket in a strand of electric lights such as decorative holiday or ornamental lights, or other lighting strand assemblies, connected in series and circuit sets containing a plurality of lights on one circuit. If one bulb is missing or is defective or otherwise non-functional, the plurality of lights in that circuit or entire strand will fail to illuminate as well.

The present invention is therefore directed to a diagnostic and test kit that allows a user to attach the device to the wiring of string lighting assemblies prepared in series wherein the lighting assembly is not functioning. The test kit allows the user to place the device onto the wiring in various areas of the string lighting assembly until the defective bulb is precisely identified. The device and methods described herein therefore, allow the user to simply replace a defective bulb in order to get the string lighting assembly back to working order, rather than spending significant time and effort to identify and then replace the defective bulb.

The test kit and method herein also encourages repair and reuse of string lighting assemblies that contain defective bulbs rather than the typical practice in which a user simply throws out the non functioning light string assembly and purchases a new one due to the low cost of replacing such string assemblies.

DETAILED DESCRIPTION OF THE INVENTION

The present invention provides a device and method that allows a user to effectively and precisely test, diagnose and identify defective bulbs and/or fuses in a lighting assembly and allow such user to replace the identified defective or non-functional parts and bulbs of the lighting assembly that has electrically powered bulbs arranged in series. It is well known with holiday and occasion lighting, a single defective or non-functioning bulb in such a lighting assembly will cause a section of lights or an entire light assembly to go out and fail to illuminate. In these instances, it is a difficult, cumbersome and time-consuming task for a user to determine the exact bulb that is defective.

The most frequent result of defective or non-functioning lighting assemblies is that the user simply discards the assembly in favor of purchasing a new one. The relatively low cost of such assemblies leaves little incentive for a user to attempt to diagnose, identify and repair a defective bulb in a holiday or occasion lighting assembly.

It is therefore, a primary object of the present invention to provide an improved method and test device for identifying and detecting a defective or non-functional light bulb that is situated in a lighting assembly set up in series. The present invention therefore not only saves the user the time and expense of purchasing a new lighting assembly but also contributes to the preservation of natural resources and the environment by keeping otherwise good lighting assemblies out of land fills.

In a preferred embodiment of the invention, the test kit of the invention employs use of a battery or other electrical power source. Examples of power sources that can be used include but are not limited to the following: batteries of all kind, most especially 9-volt batteries that possess electrodes and attachment points for wiring leads of the invention, AC/DC power sources, rechargeable batteries, and other sources of power as are known in the art.

The test kit further employs use of electrodes that are attached to the power source with the electrodes attached to conductive wiring leads. The conductive wiring leads in turn, are connected electrically to terminals of the invention. The terminals are prepared from conductive material and include aspects that are designed to penetrate and puncture the outer protective wire covering of typical lighting assembly wiring in order to create a circuit when engaged with the wiring of a lighting assembly.

Figure 3:
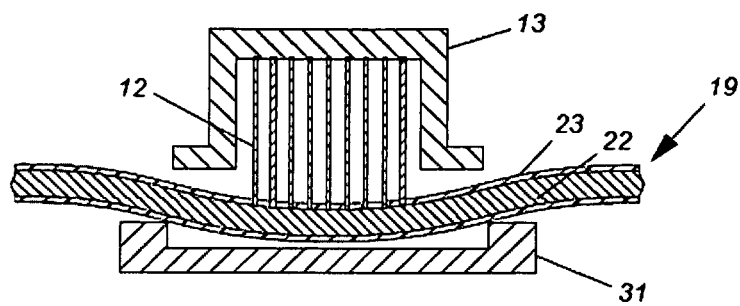
FIG. 3 is a side view of the nail beds that make up a portion of the terminals of the test kit. As illustrated, the terminal caps contain sharp conductive metal nails that pierce the outer protective layer of the wiring in order to create a circuit.

FIG. 3 and other Figures herein illustrate the terminals of the invention however, it will be understood by one of skill in the art that other designs that will puncture the outer cover of wire in order to establish an electrical circuit can likewise be employed as a wire clip of the invention. Likewise, conductive wiring of the invention and types thereof will be known to those of relevant skill in the art and are hereby incorporated by reference to fall within the scope of the present invention.

In yet another preferred embodiment of the invention, the test kit will be employed in a number of different ways in order to test and precisely identify non-functioning bulbs and allow the replacement of defective or non-functioning light bulbs of lighting assemblies as envisioned herein. For example, the test kit can be used to determine whether an entire lighting assembly is functioning or to determine if a specific section of the lighting assembly is in good functioning order. In such a scenario, the terminals of the invention will be placed and fixed on a section of wiring suspected of having a broken bulb.

The section of lighting assembly to be tested can include all the bulbs of the assembly, it can include a section of wiring which contains a large number of bulbs, or it can include a section of assembly wiring that contains only a few or even a single bulb.

As envisioned herein, the invention is used as follows: the wire leads of the test kit are connected to a power source such as for example, a 9-volt battery. Upon finding that a lighting assembly is not functioning the user will examine the wiring on the assembly in order to ascertain if any bulbs appear to be broken or burned out. Thereafter, the user unplugs the lighting assembly strand from its electrical power source and connects the first and second terminals to a desired section of the lighting assembly wire or strand. To do so, a first terminal is attached to wiring on the assembly and the terminal is tightened to such a degree that its sharp "bed of nails" penetrates the outer protective wire insulation to establish a connection between the first terminal and the conductive copper core wiring of the assembly lighting. The second terminal is then attached to another section of the wire assembly in order to establish a closed circuit and the section of lights being tested. The lights in between these two terminals are the lights being tested for defects and functionality.

In one embodiment, a 9-volt battery is employed and attached to the test kit of the invention. In the event, upon attaching the power source to the test kit and the lighting assembly, the lighting assembly strand and bulbs associated thereof fail to illuminate then the user is now aware that the defective or non-functioning bulb is somewhere within the strand encompassed between the two terminals. The user thereafter reconnects the terminals to ever narrowing sections of the strand wiring on the assembly to encompass fewer and fewer light bulbs between the terminals until the defective or non-functioning bulb is located. The number of bulbs that can be tested is without limit and can be as few as a single light bulb as long as the circuit and all bulbs on the strand are arranged in series. The defective or non-functioning bulb is located when the terminals are placed adjacent of a single bulb and the bulb fails to illuminate.

The user then removes the defective or damaged bulb and replaces it with a new one. In the instance in which the terminals are placed on the lighting strand wiring of the lighting assembly and the bulbs illuminate, the user is then aware that there are no defective or non-functioning bulbs encompassed between the two terminals. This is an indicator to the user that a different section of the assembly wiring contains the damaged bulb and that further testing elsewhere on the strand is necessary.

Figure 1:
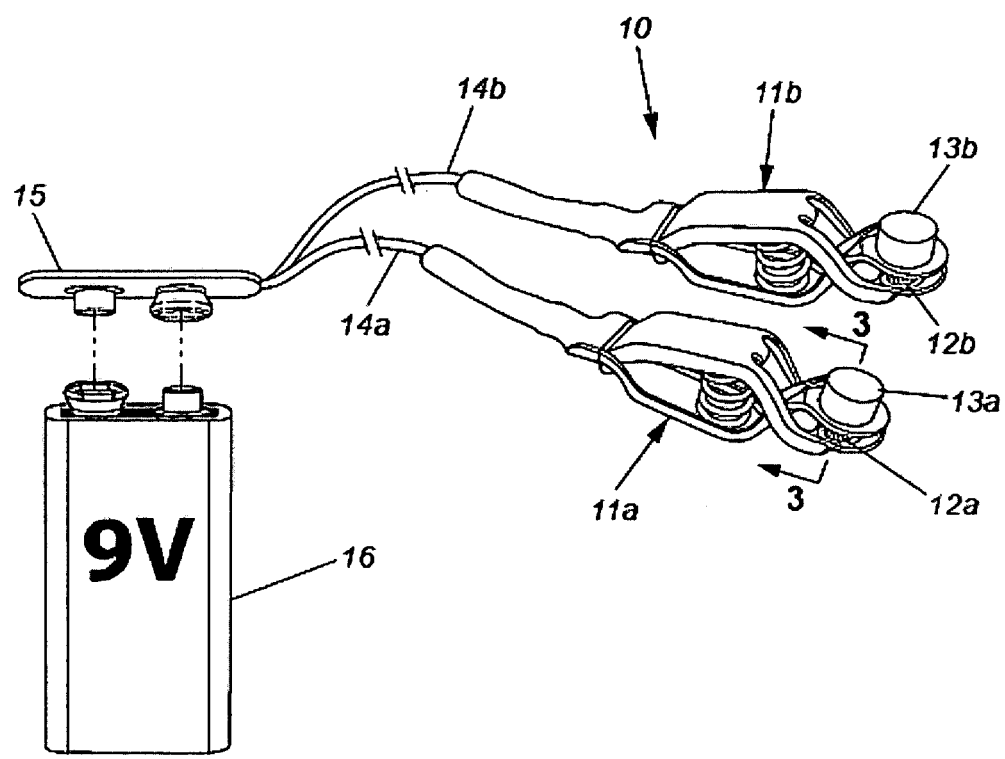
FIG. 1 depicts the basic configuration of invention. As illustrated, the invention is shown from a side angle view in which the test kit is connected to a 9-volt battery.

Turning now to the substance of FIGS. 1 through 11 and the preferred embodiments of the invention. FIG. 1 provides a view perspective of a preferred embodiment of the present test kit invention. Specifically, the test kit 10 is illustrated and shows the power source 16 connected to a battery cap 15 that leads to a first and second set of wire leads 14a, 14b. The wire leads connect electrically to the battery cap 15 which in turn, connects to the electrodes of the power source. The first and second wire leads 14a, 14b, further lead to an electrical connection to a first and second set of terminals 11a, 11b that form the primary contacts between the lighting assembly strand and the power source. An electrical connection is established by means of terminal nail beds 12a, 12b that are compressed onto the lighting assembly wiring by depressing terminal caps 13a, 13b.

Figure 2A:
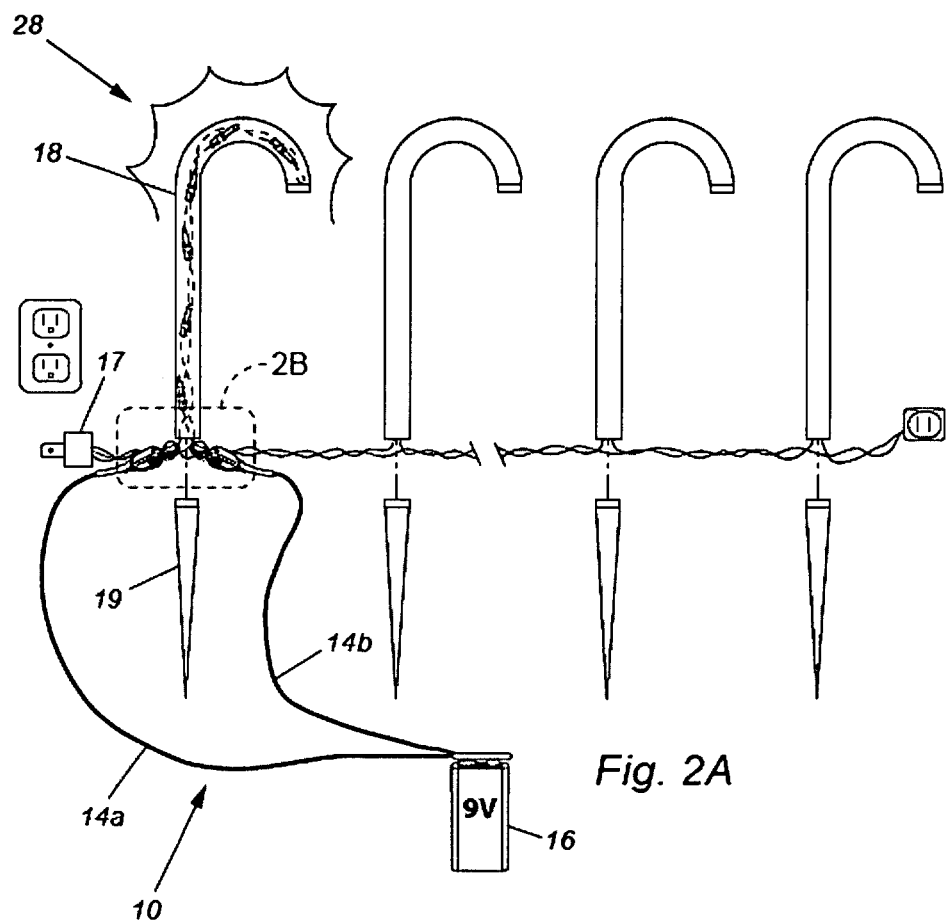
FIG. 2A depicts the invention fitted onto a string lighting assembly that is arranged with plastic candy cane structures that house portions of the string lighting assembly. As shown, the string lighting assembly properly illuminates.

FIG. 2A illustrates the test kit as it employed in testing a section of lighting assembly wiring. As illustrated, a section of a strand lighting is shown inside a "candy cane" decoration 18 and is illuminated and functioning properly 28. The lighting assembly strand is powered by means of an electrical plug 17 however the strand remains unplugged from electricity during testing by the test kit. The test kit 10 is electrically connected by means of a first and second set of wire leads 14a, 14b and a battery source 16, to the wiring of the lighting assembly.

Figure 2B:
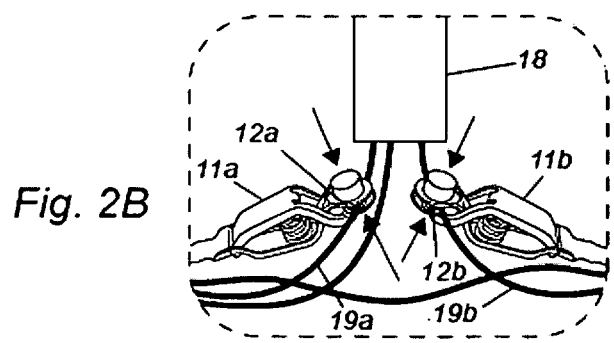
FIG. 2B is a close up view of the invention fitted onto the wiring of a string lighting assembly. Device terminals attach to wiring in order to create a closed circuit.

FIG. 2B is a detailed view of the connection between the test kit of the invention and the wiring of a lighting assembly strand wires 19a, 19b. Specifically, the terminals 11a, 11b of the invention are connected to the wiring of the lighting strand assembly by means of a first and second terminal 11a, 11b, which are made up in part, with terminal nail beds 12a, 12b that are made from conductive materials. The lighting assembly candy cane decoration 18 is situated over the light bulb wiring as the strand is tested.

In order to precisely ascertain what bulb is defective a user first disconnects the lighting assembly strand from electrical power. The user then attaches a first terminal to one section of the lighting assembly strand and thereafter, attaches a second terminal to another section of the strand lighting to create a circuit between the two terminals. In attaching the first and second terminals the user connects each terminal so that the bulbs being tested are situated between the two attached terminals so to create a closed circuit when the two terminals are electrically attached to the wiring of the strand. In the event the bulbs between the terminals light up this an indication that those bulbs are functional and that testing in another section of the strand is necessary in order to precisely identify the defective bulb which is located elsewhere on the strand.

When an alternative section of strand is selected the user repeats the steps described above keeping the bulbs to be tested between the first and second terminals as the terminals are attached to the strand wiring and observing for illumination of the light bulbs. In the event the section of strand lighting fails to illuminate, this is an indication to the user that the defective bulb or bulb socket is located somewhere between the terminals. In subsequent tests, the user attaches, detaches and reattaches the terminals in repeating sequences so that fewer and fewer bulbs are encompassed between the terminals.

By a series of elimination and repeat testing with fewer and fewer light bulbs between the terminals, the defective bulb is precisely identified when the bulb positioned between the first and second terminals fails to illuminate. Thereafter, the user can replace the defective or otherwise non-functioning bulb with a new bulb.

FIG. 3 illustrates a side view of the terminal of the invention. Specifically, each terminal is made up in part, with a terminal nail bed 12 that is held in position by a terminal cap 13. A second portion of the terminal also has a terminal nail backing 31 that acts to hold the lighting assembly strand wire 19 in place as it is pierced by the terminal nail bed. The nail bed is depressed sufficiently to pierce the non-conductive, protective outer later 23 and to establish an electrical connection between the metal in the nail bed with the conductive portion of the lighting assembly wiring 22.

Figure 4:
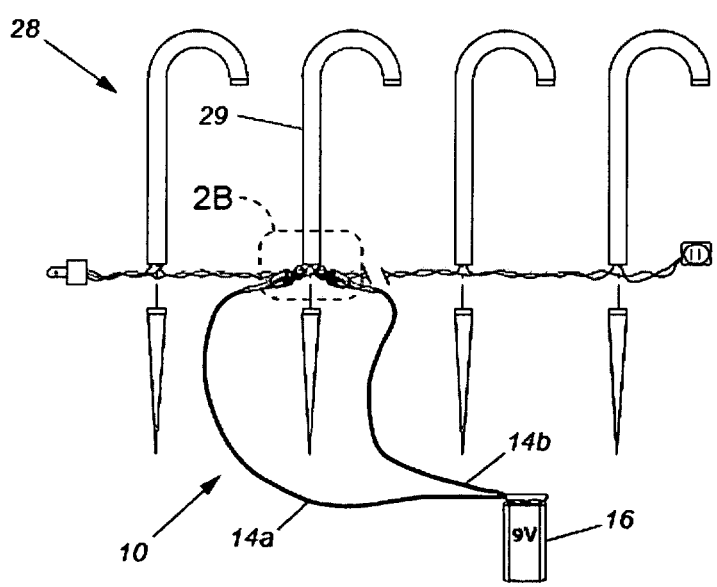
FIG. 4 shows the repair kit as it is placed on another section of the string lighting assembly demonstrating the ability to test different sections of the assembly for defective bulbs. The illustration provides a lighting assembly that is not functioning properly.

FIG. 4 illustrates the test kit of the invention 10 as employed in a lighting assembly that is not functioning properly and which fails to illuminate when powered. Specifically, a "candy cane" lighting assembly 28 is shown with a non-functioning light strand that is situated within a portion of the candy cane decoration 29. As shown, wire leads 14a, 14b lead from the power source 16 to the wiring of the lighting assembly and attached as described above.

Figure 5:
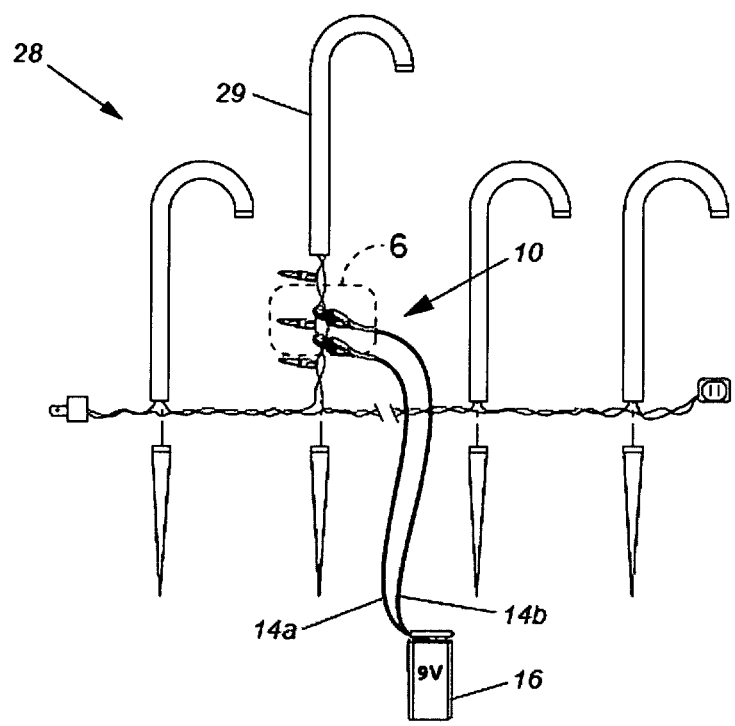
FIG. 5 shows the test kit as it is placed on yet another section of wiring on the non-functioning lighting assembly. Specifically, the test kit is shown in wiring that is interior to a holiday candy cane decoration wherein the defective bulb has been identified and is being tested for functionality.

FIG. 5 illustrates a non-functioning light strand of the assembly wherein the defective bulb has been isolated and identified. In the illustration, the candy cane decoration 29 is removed to expose the assembly strand corresponding to the defective bulb. The first and second wire leads 14, 14b and first and second terminals 11a, 11b are attached to the assembly wiring on adjacent sides of the defective bulb in order to test for functionality of the bulb.

Figure 6:
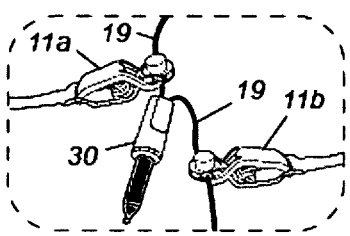
FIG. 6 shows detail of the connection sites for the terminals of the invention. As can be seen, one terminal, including the nail bed and terminal caps, is attached electrically to the wiring on one side of the light bulb being tested and a second clip is attached on wiring on the other side of the bulb being tested. The figure illustrates a non-functioning light bulb.

FIG. 6 is a detailed view of the connection between the first and second terminals 11a, 11b and the wiring of the lighting assembly 19. As shown, the bulb fails to illuminate and the test kit detects and identifies the defective bulb 30. Also encompassed with the method of detecting defective bulbs, FIG. 6 illustrates placement and attachment of the first and second terminals 11a, 11b on either side of a bulb being tested for functionality. As described above however, testing of a strand can also include more than one bulb. In other words, the first terminal can be placed on one section of strand wiring, and a second terminal placed and electrically attached to another section of the strand wiring, so that a single bulb or more than one bulb is situated between each of the terminals.

Thereafter the user detaches and reattaches the first and second terminals in a repeating fashion to encompass fewer and fewer bulbs between the terminals until the bulbs fail to illuminate. The test kit is thereafter used to test each bulb for functionality. In order to detect the precise bulb that is defective the user electrically attaches the first terminal to the wiring on one side of the single bulb and a second terminal to the other side of the bulb. If the bulb fails to illuminate, this is an indication that the bulb is defective and requires replacement.

Figure 7:
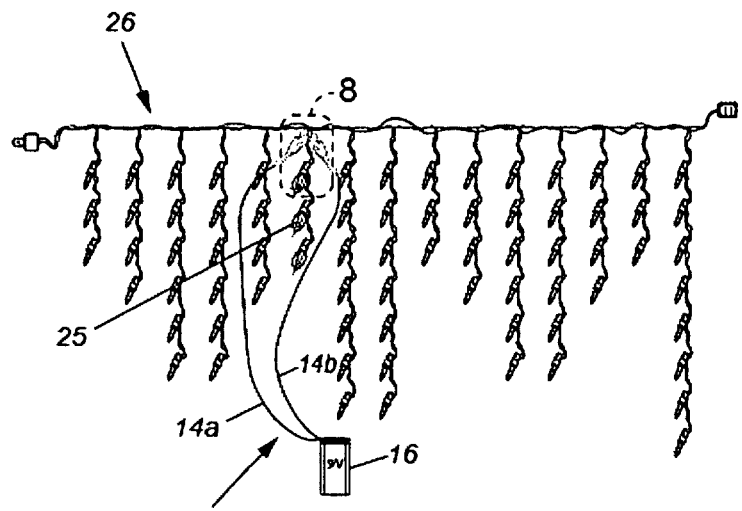
FIG. 7 shows the test kit on a different type of lighting assembly, "icicle" lighting, that employs a different wiring scheme in series. The wire leads of the invention are connected to a 9-volt battery via a battery cap on an area of the lighting assembly to be tested. As shown, the lighting assembly is functioning normally with light bulbs that illuminate when powered.

FIG. 7 demonstrates use of the invention 10 on a different type of lighting assembly, a "net" type of decorative lighting 26 wherein the light bulbs of the assembly are functioning normally and illuminate when powered 25 by the test kit. As described, the test kit 10 is fitted with a power source 16 that is electrically connected to wire leads 14a, 14b that in turn, attach to terminals of the invention.

Figure 8:
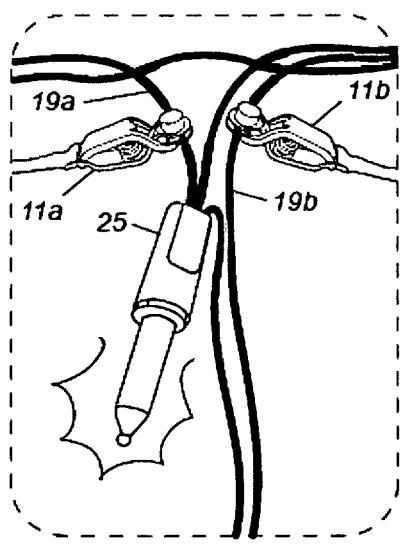
FIG. 8 is an up-close detail view of the terminals connected to wiring of a lighting assembly that is being tested for breaks in the circuit. Specifically, one terminal of the invention is attached to wiring on one side of a bulb being tested for functionality and a second wiring clip is attached to wiring on the other side of the bulb being tested. As shown, the bulb illuminates normally when powered.

FIG. 8 is a detailed close up view of a light bulb of FIG. 7 that is being tested by the invention test kit. Specifically, the first and second terminals 11a, 11b, of the invention are attached to the wiring of the lighting assembly on one side of the light bulb 19a, with a second terminal attached to the wiring on the adjacent side of the light bulb 19b. As shown, the light bulb illuminates properly and is functional.

Figure 9:
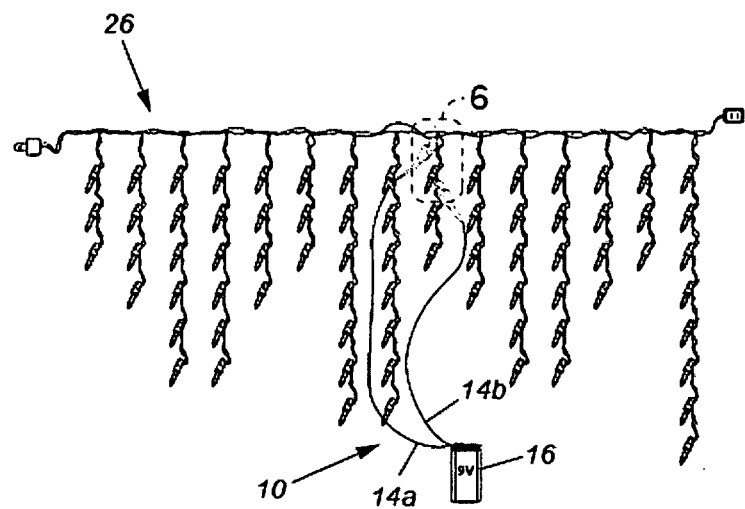
FIG. 9 shows the test kit being attached to a non-functioning "icicle" lighting assembly. As shown, the terminals of the invention attach electrically to wiring to test for functionality of lighting. The lighting in the strand being tested fails to illuminate.

FIG. 9 illustrates the invention 10 when attached and connected to an "icicle" lighting assembly strand 26 in which one or more of the light bulbs of the assembly are not functioning properly. As described, in a preferred embodiment, the invention is powered by a 9-volt battery 16 that is connected via a battery cap to first and second wire leads 14a, 14b that in turn, are connected to first and second terminals, the terminals being attached to the wires of the lighting assembly strand to test for functionality of the light bulbs situated between the two terminals of the invention.

The scope of the present application is intended to encompass different types of lighting assemblies in addition to those presented herein. The invention can be employed in any lighting assembly that is electrically connected in series regardless of length or size of the assembly.

Figure 10:
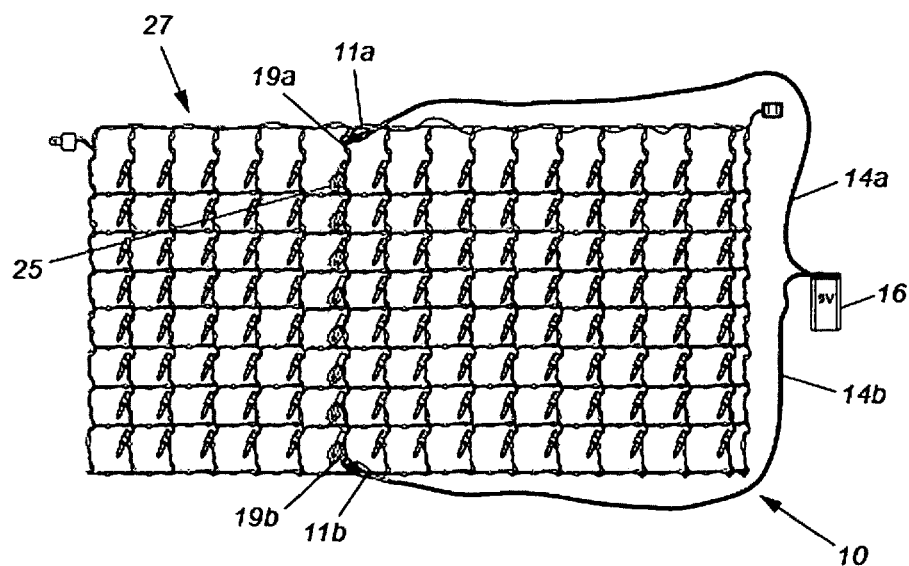
FIG. 10 shows the test kit of the invention testing a large area of a "net" type of lighting assembly with functioning light bulbs. Specifically, the test kit wire terminals are attached to a section of wiring on the upper portion of a lighting assembly, and a second wire clip is attached further away on a lower portion of the strand. Utilizing the test kit in the manner shown demonstrates the kit's ability to test large areas of a lighting assembly as well as testing individual bulbs of such assemblies. The light bulbs being tested illuminate normally.

FIG. 10 illustrates yet another embodiment of the applicability of the invention. Specifically, a "net" type of lighting assembly 27 is tested using the device of the invention. As shown, the lighting assembly functions as normal and illuminates properly when powered by electricity. This illustration demonstrates that the invention can be employed to test a strand that encompasses multiple bulbs and that such bulbs can be tested simultaneously with the test kit invention. As described above, a proper functioning bulb 25 illuminates when the first and second wire leads of the invention 14a, 14b are attached to the assembly wiring 19a, 19b via the first and second terminals of the test kit 11a, 11b.

Figure 11:
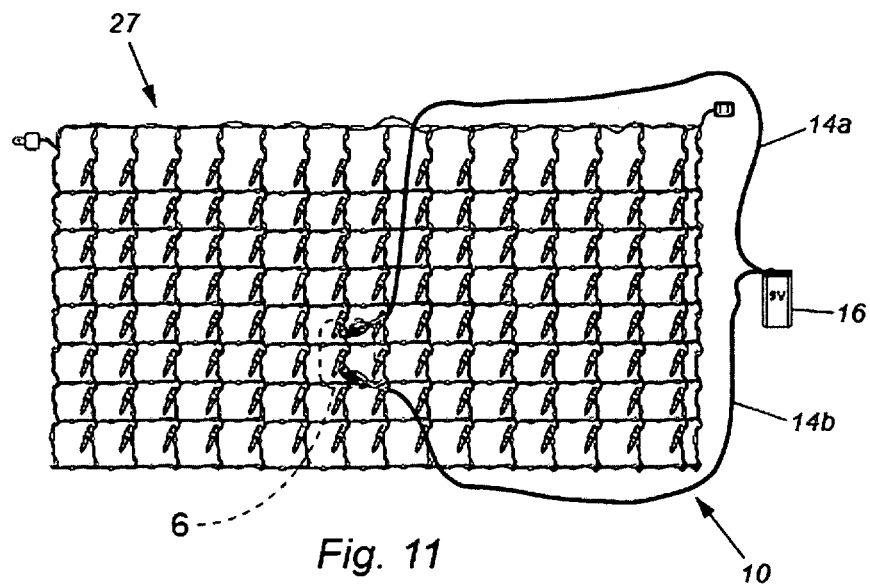
FIG. 11 shows the test kit of the invention with wire terminals attached to areas of the lighting assembly wherein a bulb fails to illuminate. As shown, one wire terminal is attached adjacent to a non-functioning bulb and a second wire terminal is attached at the other side of the bulb.

By contrast, FIG. 11 illustrates the device kit 10 as it is used to test a "net" lighting assembly 27. As shown, the battery source 16 is connected to the first and second wire leads 14a, 14b which in turn, are connected to the wiring of the lighting assembly strand at points adjacent to a bulb being tested. The lighting assembly of FIG. 11 is shown containing a non-functional bulb.

To manufacture the test kit of the invention, methods typically known in the art are employed. For example, electrical wiring such as the type shown which connect the battery source to the wire leads, are known in the art. To manufacture the terminals of the invention, conductive metal is employed to prepare the nail beds and terminal caps so to ensure that a circuit is created when the nail beds penetrate the protective covering of lighting assembly wiring. Such methods of manufacture allow for mass production as well.

Wiring used in production of the test kit is also known in the art. As described, wiring that is conductive can be employed to produce the wire leads of the invention to create a circuit between the battery/electrical source to the terminals when attached to the lighting assembly wiring. Such wiring is readily available and known in the art.

Certain advantages can be obtained in utilizing the present invention. Foremost, the invention allows a user to effectively increase the life of decorative or holiday string lighting. It further allows for a decreased burden on the environment from individuals that simply discard their series lighting string assemblies in favor of purchasing new lighting, when a bulb is burned out on their old assembly. It also decreases the millions of dollars spent by consumers on new lighting assemblies because the invention provides an easy and fast method of detecting, identifying defective or damaged bulbs and by allowing a user to easily test such bulbs to illuminate as normal.

Although the invention has been described with reference to the above examples, it will be understood that modifications and variations are encompassed within the spirit and scope of the invention. Accordingly, the invention is limited only by the following claims.

What is claimed is:

1. A test kit comprising:
a power source,
a battery cap,
a first and second wire lead,
a first and second terminal and a set of terminal caps,
the test kit allowing a user to test and identify non-functional light bulbs in a lighting assembly strand wherein, the first and second terminals are electrically attached to a single wire of a lighting assembly strand that is set up electrically in series,
wherein the power source is connected to the battery cap that lead to the first and second wire leads, the first and second wire leads further lead to an electrical connection to the first and second terminals that form primary contacts between the lighting assembly strand and the power source,
wherein the first and second terminals are electrically attached to the single wire of the lighting assembly strand by the terminal caps which contain a nail bed comprised of miniature wire piercing conductive elements that have sharpened ends that are compressed onto the single wire by depressing the terminal caps for wire piercing through a non-conductive protective outer layer of the single wire, and wherein all the nails in the nail bed are in continuous electrical contact with one another, the first and second terminals attached on opposite sides of a light bulb or plurality of light bulbs to be tested to create a closed circuit to allow the user to identify a position of a non-functioning light bulb that requires replacement in the lighting assembly strand being tested.

2. The test kit of claim 1 wherein the power source is a battery and further wherein the battery cap is attached to the battery to supply an electrical current to the first and second wire leads and to the first and second terminals.

3. The test kit of claim 2 wherein the battery is a 9-volt battery.

4. The test kit of claim 3 wherein the battery is either rechargeable or non-rechargeable.

5. The test kit of claim 1 wherein the power source is AC/DC.

6. The test kit of claim 1 wherein the first terminal is attached electrically to a section of the lighting assembly strand and the second terminal is attached electrically to another section of the lighting assembly strand wherein there are 5 or more light bulbs between the first and second terminals.

7. The test kit of claim 1 wherein the first terminal is attached electrically to a section of the lighting assembly strand and the second terminal is attached electrically to another section of the lighting assembly strand wherein there are between 1 and 4 light bulbs between the first and second terminals.

8. The test kit of claim 1 wherein the first terminal is attached electrically to a section of the lighting assembly strand and the second terminal is attached electrically to another section of the lighting assembly strand wherein there is no more than one light bulbs between the first and second terminals.

9. A method of identifying a defective, non-functioning light bulb or plurality of light bulbs in a lighting assembly strand set up electrically in series wherein a user attaches a test kit comprising a power source, a battery cap, a first and second wire lead, a first and second terminal and a set of terminal caps, the method comprising the steps of:
a) unplugging the lighting assembly strand from its electrical power source;
wherein the power source is connected to the battery cap that lead to the first and second wire leads, the first and second wire leads further lead to an electrical connection to the first and second set of terminals that form primary contacts between the lighting assembly strand and the power source,
b) electrically attaching the first and second terminals to a single wire of the lighting assembly strand by terminal caps which contain a nail bed comprised of miniature wire piercing conductive elements that have sharpened ends that are compressed onto the single wire by depressing the terminal caps for wire piercing through a non-conductive protective outer layer of the single wire, and wherein all the nails in the nail bed are in continuous electrical contact with one another,
c) the first and second terminals being attached on opposite sides of a light bulb or plurality of light bulbs on the lighting assembly strand to be tested so to create a closed circuit in the lighting assembly strand wiring;
d) connecting the power source to the first and second wire leads;
e) observing the bulb or plurality of bulbs for illumination;
f) in the instance wherein illumination of the bulb or plurality of bulbs is not observed, the user detaches and electrically reattaches the first and second terminals to include an ever narrowing number of bulbs which occupy the strand between the two terminals;
g) repeating the process of step (f) until the defective bulb or bulbs are identified and identified as the bulb or plurality of bulbs that fail to illuminate when attached to the test kit; and
h) replacing the defective bulb with a new, functional bulb or plurality of new bulbs.

10. The method of claim 9 wherein the first terminal is attached electrically to a section of the lighting assembly strand and the second terminal is attached electrically to another section of the lighting assembly strand wherein there are more than 5 light bulbs between the first and second terminals.

11. The method of claim 9 wherein the first terminal is attached electrically to a section of the lighting assembly strand and the second terminal is attached electrically to another section of the lighting assembly strand wherein there are between 1 and 4light bulbs between the first and second terminals.

12. The method of claim 9 wherein the first terminal is attached electrically to a section of the lighting assembly strand and the second terminal is attached electrically to another section of the lighting assembly strand wherein there is no more than one light bulb between the first and second terminals.

13. A method of identifying a defective, non-functioning light bulb or plurality of light bulbs in a lighting assembly strand set up electrically in series wherein a user attaches a test kit comprising a power source, a battery cap, a first and second wire lead, a first and second terminal and a set of terminal caps, the method comprising the steps of:
 a) unplugging the lighting assembly strand from its electrical power source; wherein the power source is connected to the battery cap that lead to the first and second wire leads, the first and second wire leads further lead to an electrical connection to the first and second terminals that form primary contacts between the lighting assembly strand and the power source,
 b) electrically attaching the first and second terminals to a single wire of the lighting assembly strand by terminal caps which contain a nail bed comprised of miniature wire piercing conductive elements that have sharpened ends for wire piercing through a non-conductive protective outer layer of the single wire, and wherein all the nails in the nail bed are in continuous electrical contact with one another,
 c) the first and second terminals being attached on opposite sides of a light bulb or plurality of light bulbs on the lighting assembly strand so to create a closed circuit in the lighting assembly strand wiring;
 d) connecting the power source to the first and second wire leads;
 e) observing the bulb or plurality of bulbs for illumination;
 f) in the instance wherein illumination of the bulb or plurality of bulbs is observed, the user detaches and electrically reattaches the first and second terminals at a different section of the lighting assembly strand until illumination of the bulb or plurality of bulbs fails to occur;
 g) once the section of the strand that fails to illuminate is identified, detaching and electrically reattaching the first and second terminals to include an ever narrowing number of bulbs which occupy the strand between the two terminals;
 h) repeating the process of step (g) until the defective bulb or bulbs are identified, and identified as the bulb or plurality of bulbs that fail to illuminate when attached to the test kit; and
 h) replacing the defective bulb with a new, functional bulb or plurality of new bulbs.

14. The method of claim 13 wherein the first terminal is attached electrically to a section of the lighting assembly strand and the second terminal is attached electrically to another section of the lighting assembly strand wherein there are more than 5light bulbs between the first and second terminals.

15. The method of claim 13 wherein the first terminal is attached electrically to a section of the lighting assembly strand and the second terminal is attached electrically to another section of the lighting assembly strand wherein there are between 1 and 4light bulbs between the first and second terminals.

16. The method of claim 13 the first terminal is attached electrically to a section of the lighting assembly strand and the second terminal is attached electrically to another section of the lighting assembly strand wherein there is no more than one light bulb between the first and second terminals.

* * * * *